United States Patent [19]

Gariazzo et al.

[11] 4,133,044
[45] Jan. 2, 1979

[54] FAILURE-RESISTANT PSEUDO-NONVOLATILE MEMORY

[75] Inventors: Michael C. Gariazzo, Bowie; Leonard S. Haynes, Columbia, both of Md.

[73] Assignee: The United States of America as represented by the Secretary of the Navy, Washington, D.C.

[21] Appl. No.: 881,927

[22] Filed: Feb. 28, 1978

[51] Int. Cl.$^2$ .............................................. G11C 21/00
[52] U.S. Cl. .................................. 365/78; 307/221 R; 365/222
[58] Field of Search ............... 307/238, 221 R, 221 C, 307/221 D; 365/78, 222

[56] References Cited

U.S. PATENT DOCUMENTS 4,065,756  12/1977  Panigrahi .................. 365/78

Primary Examiner—Terrell W. Fears
Attorney, Agent, or Firm—R. S. Sciascia; A. L. Branning; G. J. Perry

[57] ABSTRACT

Disclosed is a plurality of parallel resistive-capacitive clamping circuits individually coupling the bit "input" and bit "output" terminals of a multi-bit, serial/parallel (S/P), synchronous/asynchronous (S/A) shift register (e.g., CD-4034A). The clamping circuits provide the contents of the shift register with an increased immunity from the effects of transients, radiation, and temporary power failures.

3 Claims, 2 Drawing Figures

FAILURE-RESISTANT PSEUDO-NONVOLATILE MEMORY

BACKGROUND OF THE INVENTION

This invention relates generally to integrated circuit memory devices and more specifically to circuits for causing such memory devices to become less volatile.

Volatile memories are those in which stored data is lost in the event of temporary power shut down or large electrical signal transients appearing on its data lines. Very often, external phenomena such as radiation induce such transients. This volatility causes the data stored in such a memory to be unreliable and suspect.

SUMMARY OF THE INVENTION

Accordingly, the present invention provides "add-on" circuitry that makes an integrated circuit memory device less volatile as a data storage element. Clamping circuit means coupled to each data bit line provide data storage external to the memory integrated circuit and permit the memory to be continuously refreshed.

A CD4034A integrated circuit is an eight bit serial/parallel, synchronous/asynchronous shift register having eight pairs of data bit lines. Identical clamping circuit means, each including two resistors and a capacitor are coupled to each of these data bit pairs.

A controller circuit provides for the shifting of serial/parallel and synchronous/asynchronous modes at appropriate times to allow the loading of data into memory.

OBJECTS OF THE INVENTION

It is therefore the object of the present invention to provide a micropower memory device having extremely high immunity from the effects of transients, radiation, and temporary power failures.

BRIEF DESCRIPTION OF THE DRAWINGS

Other objects and many of the attendant advantages of the present invention will be readily apparent as the invention becomes better understood by reference to the following detailed description with the appended claims, when considered in conjunction with the accompanying drawings, wherein:

DESCRIPTION OF THE PREFERRED EMBODIMENTS

Figure 1:
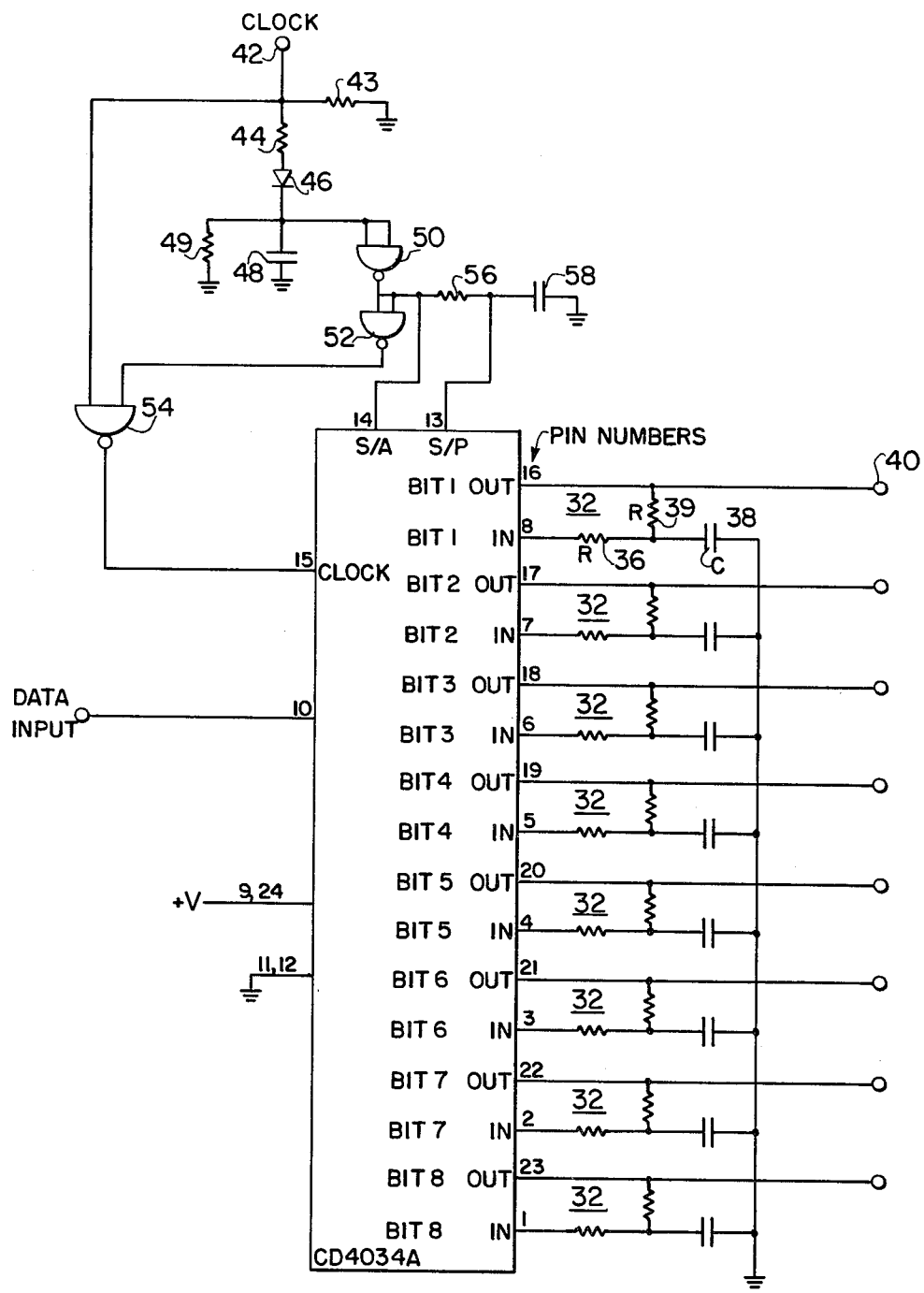
FIG. 1 is a schematic diagram of the pseudo nonvolatile memory according to the present invention.

Referring now to the drawings wherein like reference characters designate like or corresponding parts throughout, FIG. 1 is a schematic diagram of the pseudo nonvolatile memory according to the present invention.

The heart of this memory circuit is an eight bit serial/parallel, (S/P), synchronous/asynchronous (S/A), shift register integrated circuit 30. Specifically, a CD 4034A is shown, but similar devices could easily be substituted with appropriate pin number connection changes. Pin connections shown on FIG. 1 are specific to the CD 4034A. Inputs for data bits 1 through 8 are at pins 8, 7, 6, 5, 4, 3, 2, and 1 respectively and outputs for data bits 1 through 8 are at pins 16, 17, 18, 19, 20, 21, 22, and 23. Serial/parallel operation is selected by logic level input to pin 13 and synchronous/asynchrous operation is selected by logic level input to pin 14. Parallel, and asynchrous operation are selected by a logic level "1" being applied to pin 13 and a logic level "1" being applied to pin 14.

Identical clamping circuits 32 are coupled to each of the data bit line pairs, eg. data bit 1 input on pin 8 and data bit 1 output on pin 16 form a line pair for data bit 1. Each clamping circuit 32 includes two resistors 34 and 36 of preselected value R and a capacitor 38 having preselected value C. The series combination of resistor 34 and capacitor 38 couples the output pin for each bit (eg. pin 16 for bit 1) to ground with one lead of the resistor coupled to the pin and one lead of the capacitor coupled to ground. Second resistor 36 couples the junction of resistor 34 and capacitor 38 to each data bit input pin (e.g. pin 8 for bit 1). Memory outputs 40 for each bit are taken directly from the appropriate output pins 16, 17, 18, 19, 20, 21, 22, and 23.

When operating in the parallel/asynchrous mode (logic level "1" applied to pin 13 and 14), capacitors 38 are charged at the same voltages as their respective bit output pins. These capacitor voltages are fed through resistors 36 back to their corresponding asynchrous, parallel data bit input pin. By this process, each bit of the memory is constantly being refreshed by the voltage on capacitor 38. Since a certain quantity of energy is required to modify the charges on these capacitors 38, the data at each bit, once stabilized will remain there until the capacitor charges are eroded by external drain. Signal changes on output lines 40 or at control pins 13 and 14 which last less than RC/2 seconds will therefore fail to alter the stored data.

An external clock (not shown) is coupled to a clock input port 42. This port 42 is coupled via a resistor 44 and diode 46 to a clock capacitor 48 which is in turn tied to ground. In the embodiment schematically diagrammed in FIG. 1, resistor 44 has a value of 20k and capacitor 48 has a value of 15 $\mu f$. A 10k resistor 43 couples this port 42 to ground. A clock capacitor discharge resistor 49 having a value of 1.5M, parallels clock capacitor 48. All inputs to a NAND gate 50 are coupled to the ungrounded side of clock capacitor 48. The output of gate 50 is coupled to all of the inputs to a second NAND gate 52, the output of which is coupled to one of two inputs of a third NAND gate 54. The second input to NAND gate 54 is coupled to clock input port 42. A series resistor 56 having a value of 1M and a capacitor 58 having a value of 0.1 $\mu f$ couple the output of gate 50 to ground. Pin 14, the synchronous/asynchrous select pin is tied directly to the output of gate 50. Pin 13, the parallel/serial select pin is tied to the junction of resistor 56 and capacitor 58. The output of gate 54 is tied to the clock input, pin 15 of integrated circuit 30.

Data input to circuit 30 is via pin 10, power supply voltage V is applied to pins 9 and 24, and pins 11 and 12 are tied to ground.

Figure 2:
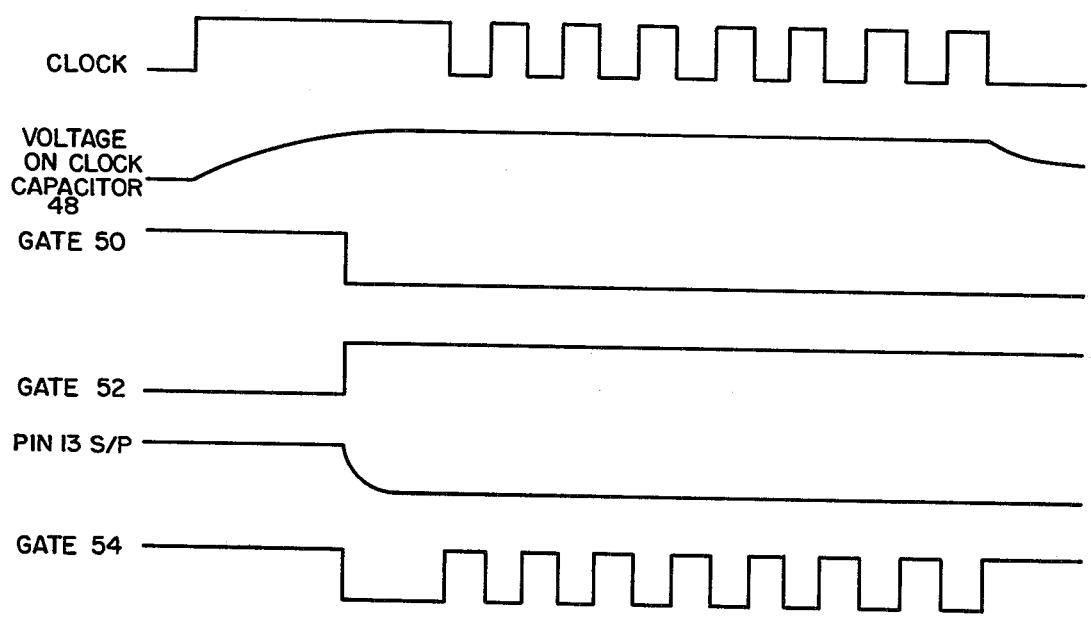
FIG. 2 is a timing and waveform diagram illustrating the operation of the memory according to the present invention.

To initially store the desired data in memory 30, the serial, synchronous mode of operation is first selected. Referring now to FIG. 2, the clock line is held high sufficiently long to charge capacitor 48 to a logic level "1" as illustrated on this waveform figure. When this charge has been achieved, the output of gate 50 becomes a logic level "0", causing the output of gate 52 to become a logic level "1" and causing the output of gate 54 to become a logic level "0" as shown in FIG. 2. When the output of gate 50 goes to logic level "0", the synchronous operation mode is selected and after a short delay caused by the action of resistor 56 and capacitor 58, the serial mode is selected. Thereafter information from the data line input to pin 10 is loaded serially with each negative transition of the clock. This loading can be confirmed by recirculating the data.

After clocking has ceased, capacitor 48 gradually discharges through resistor 49 until it reaches logic level "0", forcing gate 50 to become a logic level "1" thereby returning the memory to its parallel, asynchrous mode. At that time, all capacitors 38 are fully charged to their new values, and the memory is protected.

Therefore, it is apparent that there has been provided a memory that is buffered against and protected from signal transients by the memory refreshing action of capacitors 38. Because of the charges stored on capacitors 38, this memory has the ability to recover to its proper state after temporary alteration, possibly caused by radiation or other external phenomena. This immunity is achieved regardless of whether temporary alteration occurs at data bit outputs 40, clock input 42, or the control inputs (S/A or S/P).

The memory size can be expanded as much as desired simply by cascading additional CD 4034A memory circuits 30, each of which adds eight bits. The degree of protection can be varied by properly selecting the values of resistors 34 and 36 and capacitors 38.

Obviously, other embodiments and modifications of the present invention will readily come to those of ordinary skill in the art having the benefit of the teachings presented in the foregoing description and the drawings. It is, therefore, to be understood that this invention is not to be limited thereto and that said modifications and embodiments are intended to be included within the scope of the appended claims.

What is claimed and desired to be secured by Letters Patent of the United States is:

1. A multiple bit memory circuit comprising:
    at least one shift register having a plurality of data bit line pairs, each pair having an input and an output, said shift register being selectably capable of operation in either synchronous or asynchronous modes and in either serial or parallel modes or any combination thereof;
    means for selecting said modes of operation responsive to a pattern of clock pulses generated external to said memory circuit; and
    clamping circuit means coupled to each of said data bit lines for storing data from said data bit lines during operation of said shift register in said serial/synchronous mode and for feeding back said data to said shift register during operation of said shift register in said parallel/asynchronous mode.

2. The memory circuit of claim 1 wherein said clamping circuit means comrpises:
    a first resistor having two leads and having one such lead coupled to said output data bit lines;
    a second resistor having two leads and having one such lead coupled to said input data bit line and having said second lead coupled to said second lead of said first resistor; and
    a capacitor having two leads and having one such lead coupled to said second level of said first resistor and said second lead of said second resistor and having said second capacitor lead coupled to ground.

3. A multiple bit memory circuit comprising:
    at least one shift register having a plurality of data bit line pairs, each pair having an input and output, said shift register being selectably capable of operation in either synchronous and asynchronous modes and in either serial or parallel modes or any combination thereof wherein said synchronous or asynchronous mode is selected by logic level input to a synchronous/asynchronous (S/A) select pin and wherein said serial or parallel mode is selected by logic level input to a serial/parallel (S/P) select pin, and having a clock input pin;
    a clock input port coupled to an external source of clock pulses;
    a clock capacitor diode coupled between said clock input port and ground;
    a first logic gate having inputs coupled to said clock capacitor and an output;
    a second logic gate having inputs coupled to said output of said first gate and having an output;
    a third logic gate having a first input coupled to said output of said second gate and having a second input coupled to said clock input port and having an output port coupled to said clock input pin of said shift register; wherein said (S/A) select pin is coupled to said output of said first gate and to said inputs of said second gate, and wherein said (S/P) select pin is resistor coupled to said output of said first gate and said inputs of said second gate and capacitor coupled to ground; whereby the operating modes of said shift register are selected responsive to said external source of clock pulses; and
    clamping circuit means coupled to said data bit lines comprising:
        a first resistor having two leads and having one such lead coupled to said output data bit line;
        a second resistor having two leads and having one such lead coupled to said input data bit line and having said second lead coupled to said second lead of said first resistor; and
        a capacitor having two leads and having one such lead coupled to said second lead of said first resistor and said second lead of said second resistor and having said second capacitor lead coupled to ground; whereby data from said data bit lines are stored within said clamping circuit means during operation of said shift register in said serial/synchronous mode and fed back to said data bit lines during operation of said shift register in said parallel asynchronous mode.

* * * * *